United States Patent
Chan et al.

(10) Patent No.: US 7,663,184 B1
(45) Date of Patent: Feb. 16, 2010

(54) MEMORY AND METHOD OF FABRICATING THE SAME

(75) Inventors: Yao-Fu Chan, Hsinchu (TW); Ta-Kang Chu, Hsinchu (TW); Jung-Chuan Ting, Hsinchu (TW); Cheng-Ming Yih, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 12/183,358

(22) Filed: Jul. 31, 2008

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/328; 257/329; 257/330; 257/331; 257/332; 257/333; 257/334; 257/E27.091; 257/E27.096; 257/E29.262; 257/E29.274; 257/E29.313; 257/E29.318

(58) Field of Classification Search ......... 257/328–334, 257/E27.091, E27.096, E29.262, E29.274, 257/E29.313, E29.318
See application file for complete search history.

(56) References Cited

U.S. PATENT DOCUMENTS

| | | | |
|---|---|---|---|
| 5,382,534 A | 1/1995 | Sheu et al. | |
| 5,416,350 A * | 5/1995 | Watanabe | 257/330 |
| 6,211,012 B1 | 4/2001 | Lee et al. | |
| 7,232,719 B2 * | 6/2007 | Chung et al. | 438/243 |
| 7,259,421 B2 | 8/2007 | Hur et al. | |
| 7,528,035 B2 * | 5/2009 | Cheng | 438/243 |
| 7,554,148 B2 * | 6/2009 | Su et al. | 257/301 |
| 7,564,084 B2 * | 7/2009 | Song et al. | 257/296 |
| 7,569,878 B2 * | 8/2009 | Weis et al. | 257/301 |
| 2001/0022379 A1 | 9/2001 | Brush et al. | |
| 2006/0163644 A1 * | 7/2006 | Bhattacharyya | 257/316 |
| 2008/0197361 A1 * | 8/2008 | Ueno | 257/77 |
| 2008/0211020 A1 * | 9/2008 | Saito | 257/342 |
| 2008/0272430 A1 * | 11/2008 | Hur et al. | 257/330 |
| 2009/0159965 A1 * | 6/2009 | Jung | 257/331 |
| 2009/0218617 A1 * | 9/2009 | Kinzer, Daniel M. | 257/330 |

FOREIGN PATENT DOCUMENTS

TW    I237348    8/2005

* cited by examiner

*Primary Examiner*—Ida M Soward
(74) *Attorney, Agent, or Firm*—J.C. Patents

(57) ABSTRACT

A memory and a method of fabricating the same are provided. The memory is disposed on a substrate in which a plurality of trenches is arranged in parallel. The memory includes a gate structure and a doped region. The gate structure is disposed between the trenches. The doped region is disposed at one side of the gate structure, in the substrate between the trenches and in the sidewalls and bottoms of the trenches. The top surface of the doped region in the substrate between the trenches is lower than the surface of the substrate under the gate structure by a distance, and the distance is greater than 300 Å.

10 Claims, 11 Drawing Sheets

MEMORY AND METHOD OF FABRICATING THE SAME

BACKGROUND OF THE INVENTION

1. Field of the Invention

The present invention relates to a semiconductor device and a method of fabricating the same, and particularly relates to a memory and a method of fabricating the same.

2. Description of Related Art

A memory is a semiconductor device designed for storing information or data. As the functions of computer microprocessors become more and more powerful, programs and operations executed by software are increasing correspondingly. As a consequence, the demand for high storage capacity memories is getting higher and higher. The challenge of fabricating memories with significant storage capacity to satisfy such a demand is now a driving force for developing the techniques and processes of manufacturing highly integrated semiconductor devices.

Among various types of memory products, a non-volatile memory allows multiple-time data programming, reading and erasing operations, and the data stored therein can be retained even after the power to the memory is disconnected. With these advantages, the non-volatile memory has become one of the most widely adopted memories for personal computers and electronic equipment.

During the fabrication of a general non-volatile memory array, a self-align source process is performed after a plurality of gate structures are formed on a substrate, so as to remove the shallow trench isolation structure at one side of a row of gate structures and expose the trenches. Then, a doping process is performed to form a common source region in the sidewalls and bottom of the trenches and in the substrate between the trenches.

However, the depth of the trenches is usually about 2000 Å, which makes the current path of the common source region too long. Consequently, the resistance of the common source region is increased and the efficiency of the device is influenced.

SUMMARY OF THE INVENTION

Accordingly, the present invention is directed to a memory which reduces the resistance of a common source region.

The present invention is also directed to a memory which enhances the efficiency of a device.

The present invention provides a memory disposed on a substrate in which a plurality of trenches is arranged in parallel. The memory includes a gate structure and a doped region. The gate structure is disposed between the trenches. The doped region is disposed at one side of the gate structure, in the substrate between the trenches and in the sidewalls and bottoms of the trenches. The top surface of the doped region in the substrate between the trenches is lower than the surface of the substrate under the gate structure by a distance, and the distance is greater than 300 Å.

According to an embodiment of the present invention, the above-mentioned distance is greater than 500 Å, for example.

According to an embodiment of the present invention, the above-mentioned distance is greater than 700 Å, for example.

According to an embodiment of the present invention, the above-mentioned gate structure includes a dielectric layer, a floating gate, an inter-gate dielectric layer, and a control gate sequentially disposed on the substrate.

According to an embodiment of the present invention, the memory further includes an isolation structure disposed in the trenches and exposing the doped region.

The present invention also provides a memory disposed on a substrate in which a plurality of trenches is arranged in parallel. The memory comprises a gate structure and a doped region. The gate structure is disposed between the trenches. The doped region is disposed at one side of the gate structure, in the substrate between the trenches and in the sidewalls and bottoms of the trenches. The top surface of the doped region in the substrate between the trenches is lower than the surface of the substrate under the gate structure by a distance, and the distance is greater than 0.15 times a depth of the trenches.

According to an embodiment of the present invention, the above-mentioned distance is greater than 0.25 times the depth of the trenches, for example.

According to an embodiment of the present invention, the above-mentioned distance is greater than 0.35 times the depth of the trenches, for example.

The present invention further provides a method of fabricating a memory. First, a substrate having a plurality of trenches arranged in parallel is provided, and an isolation structure is formed in the trenches. Thereafter, a gate structure is formed between the trenches. Afterwards, a portion of the substrate between the trenches at a side of the gate structure and the isolation structure in the trenches at the side of the gate structure are removed, so that the portion of the substrate between the trenches at the side of the gate structure is lower than a surface of the substrate under the gate structure by a distance, and the distance is greater than 300 Å. Further, a doped region is formed at the side of the substrate.

According to an embodiment of the present invention, the above-mentioned distance is greater than 500 Å, for example.

According to an embodiment of the present invention, the above-mentioned distance is greater than 700 Å, for example.

According to an embodiment of the present invention, the method of removing the portion of the substrate between the trenches at the side of the gate structure and the isolation structure in the trenches at the side of the gate structure includes the following steps. First, a patterned photoresist layer is formed to expose at least the substrate between the trenches at the side of the gate structure and the isolation structure in the trenches at the side of the gate structure. Thereafter, an etching process is performed by using the patterned photoresist layer as a mask.

According to an embodiment of the present invention, the above-mentioned gate structure includes a dielectric layer, a floating gate, an inter-gate dielectric layer, and a control gate sequentially formed on the substrate.

The present invention further provides a method of fabricating a memory. First, a substrate having a plurality of trenches arranged in parallel is provided, and an isolation structure is formed in the trenches. Thereafter, a gate structure is formed between the trenches. Afterwards, a portion of the substrate between the trenches at a side of the gate structure and the isolation structure in the trenches at the side of the gate structure are removed, so that the portion of the substrate between the trenches at the side of the gate structure is lower than a surface of the substrate under the gate structure by a distance, and the distance is greater than 0.15 times a depth of the trenches. Further, a doped region is formed at the side of the substrate.

According to an embodiment of the present invention, the above-mentioned distance is greater than 0.25 times the depth of the trenches, for example.

According to an embodiment of the present invention, the above-mentioned distance is greater than 0.35 times the depth of the trenches, for example.

The present invention reduces the height of a top surface of the common source region to shorten the current path of the common source region. Consequently, the resistance of the common source region can be reduced to enhance the efficiency of the device.

To make the above features and advantages of the present invention more comprehensible, several embodiments accompanied with figures are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
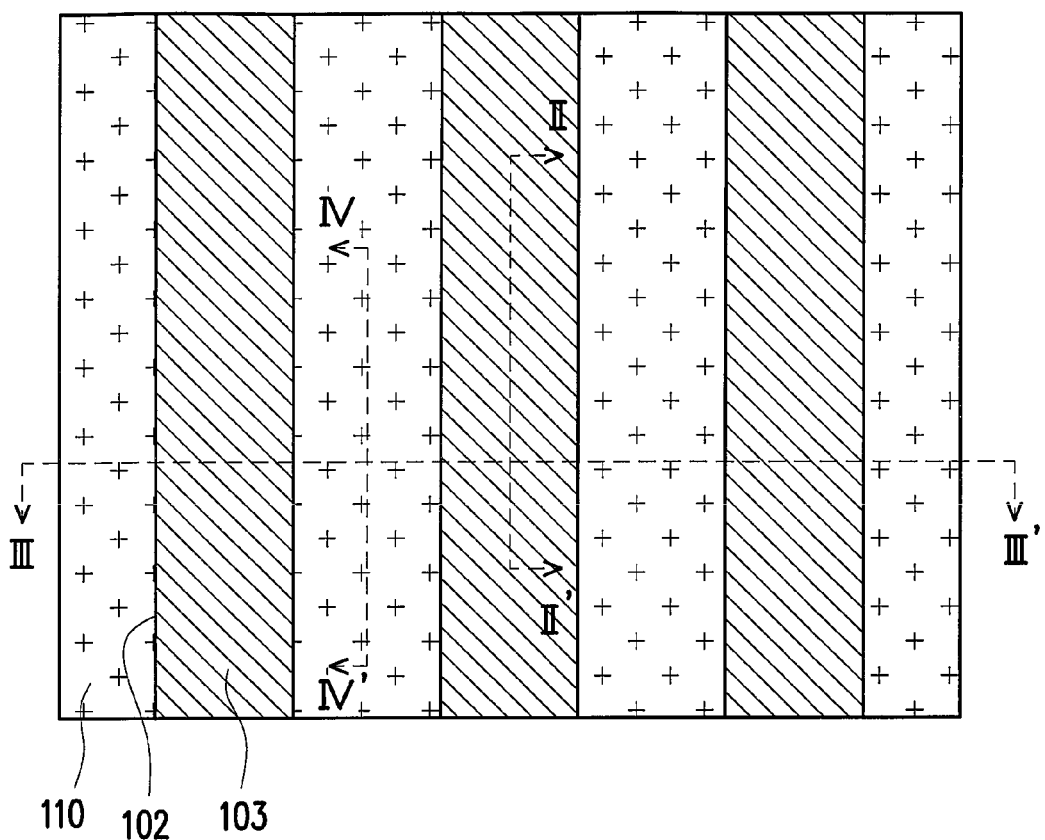
FIGS. 1A to 1D schematically illustrate top views of a method of fabricating a memory array according to an embodiment of the present invention.
Figure 2A:
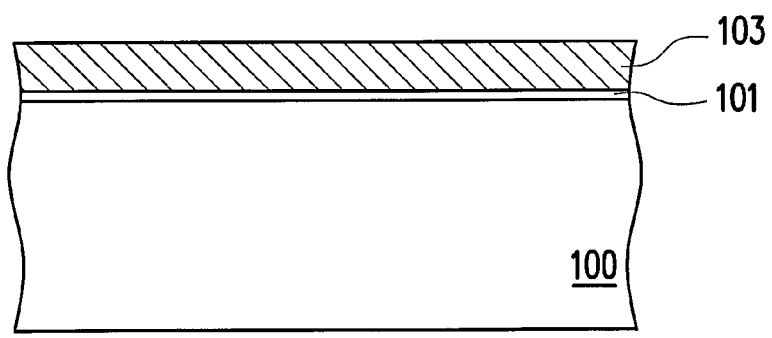
FIGS. 2A to 2D schematically illustrate cross-sectional views taken along the line II-II' in FIGS. 1A to 1D.
Figure 1B:
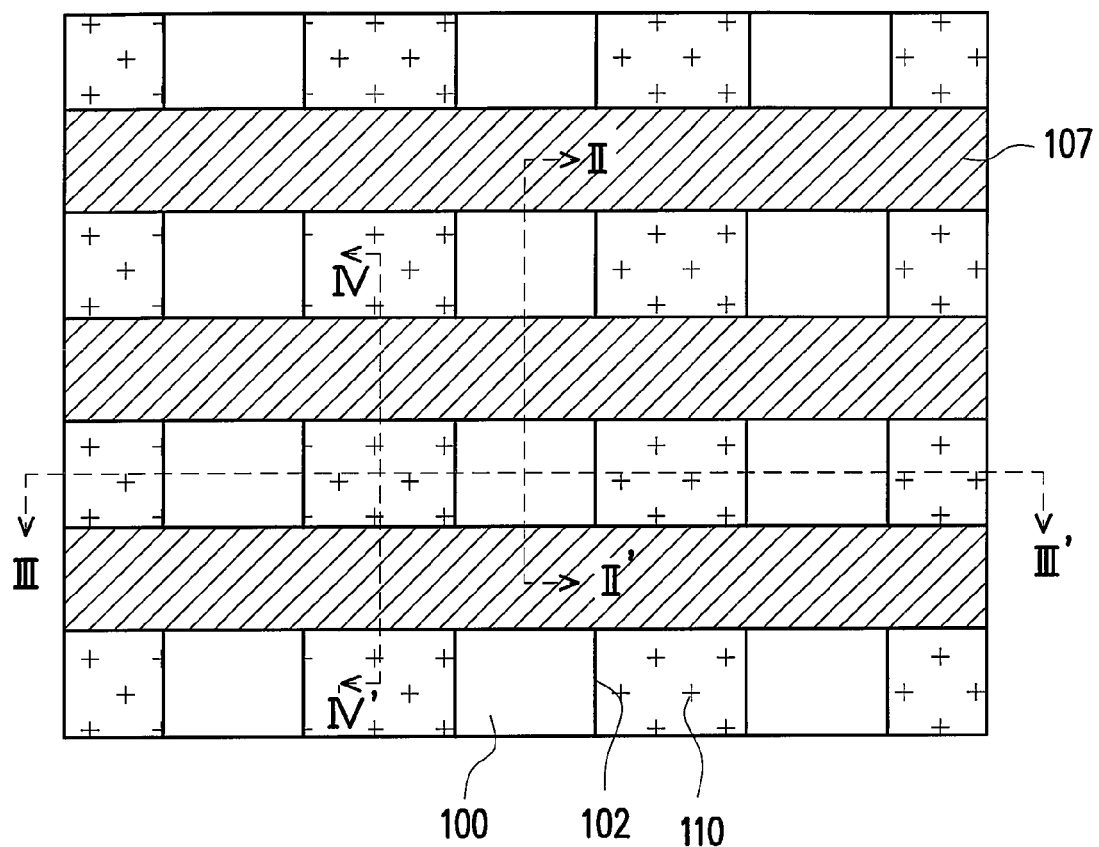
Figure 1C:
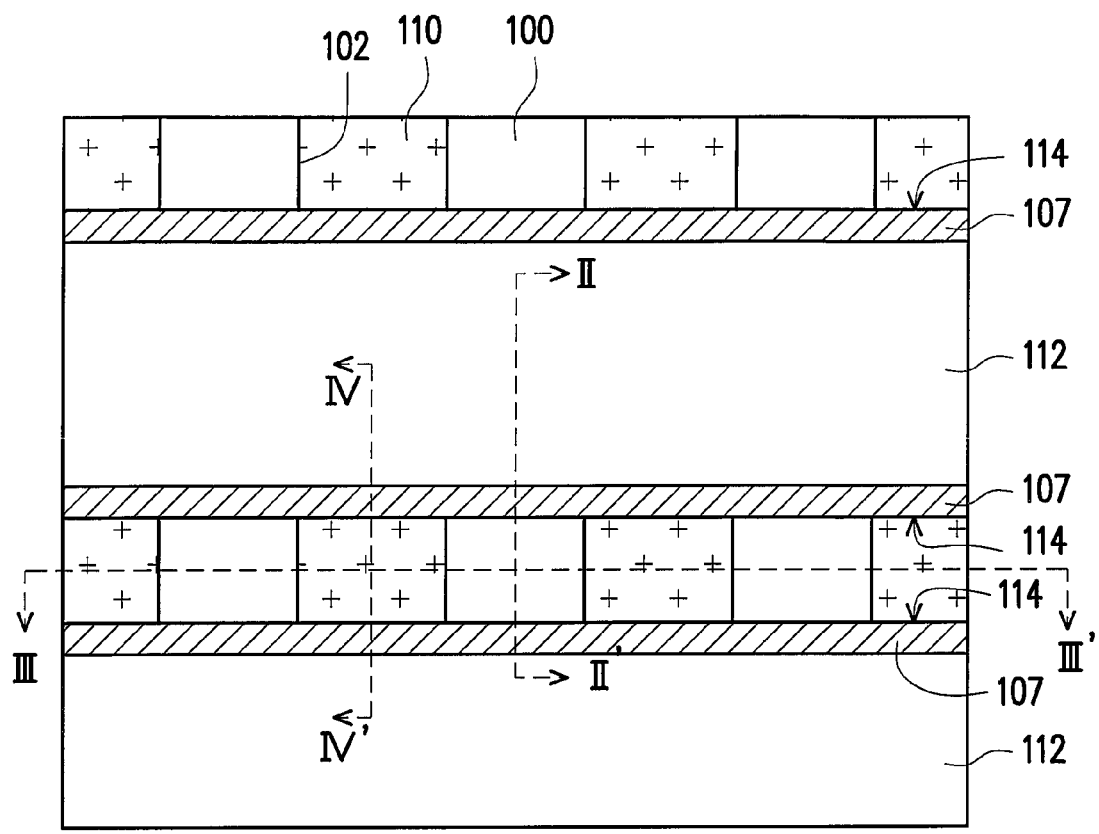
Figure 1D:
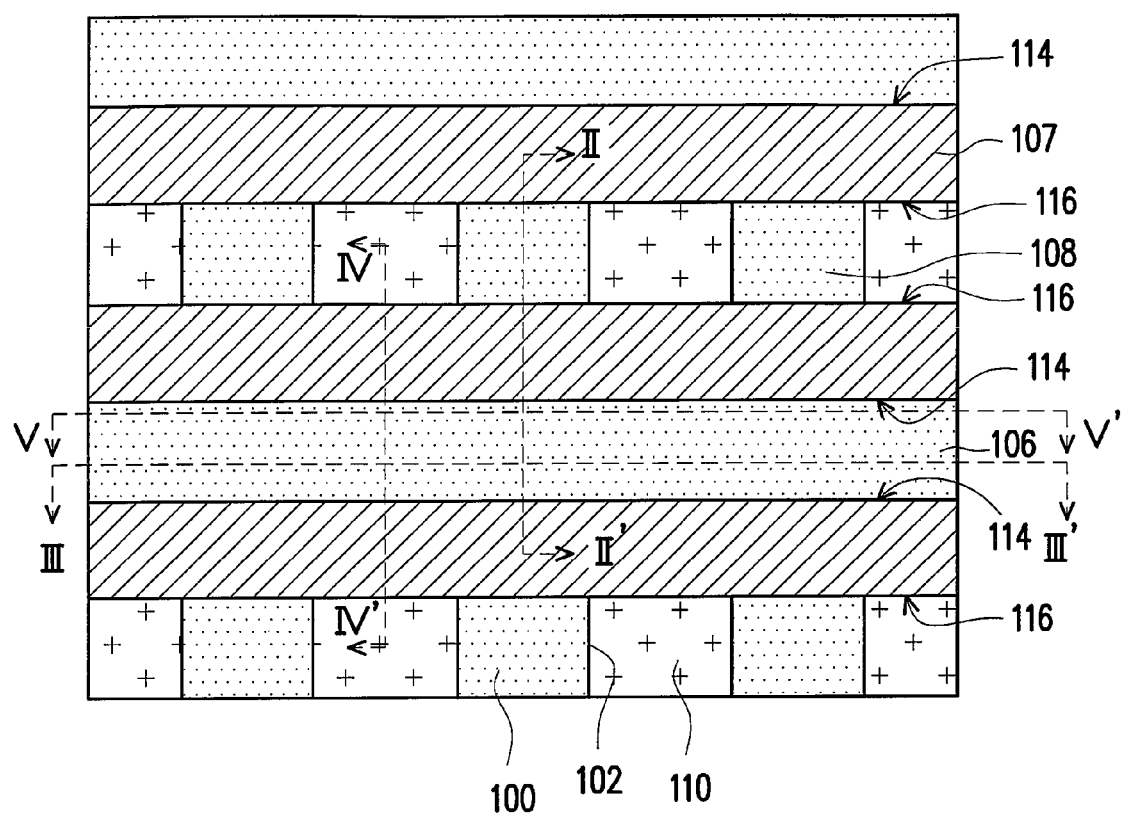
Figure 2B:
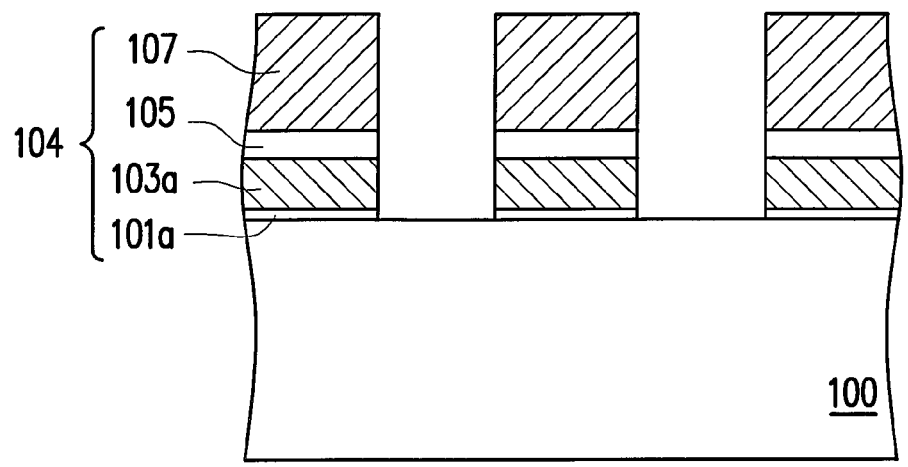
Figure 3B:
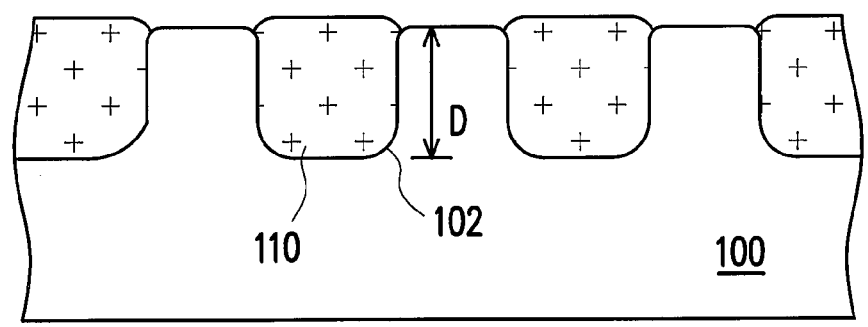
FIGS. 3A to 3D schematically illustrate cross-sectional views taken along the line III-III' in FIGS. 1A to 1D.
Figure 2C:
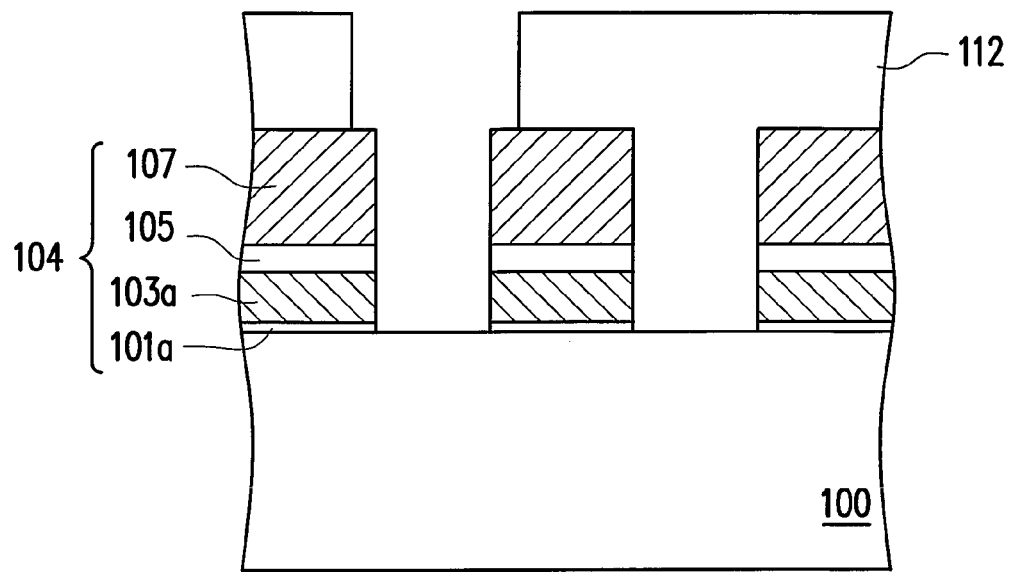
Figure 3C:
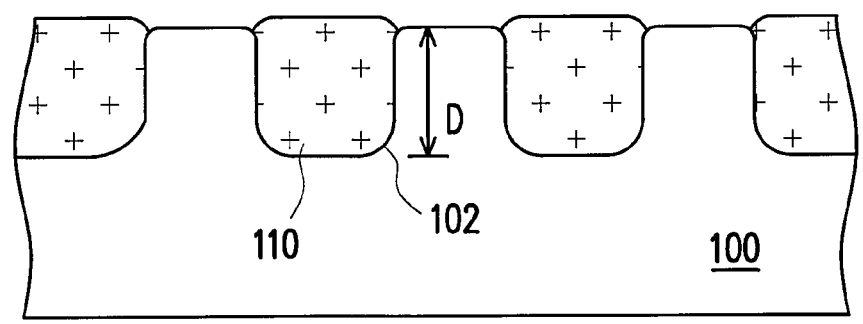
Figure 2D:
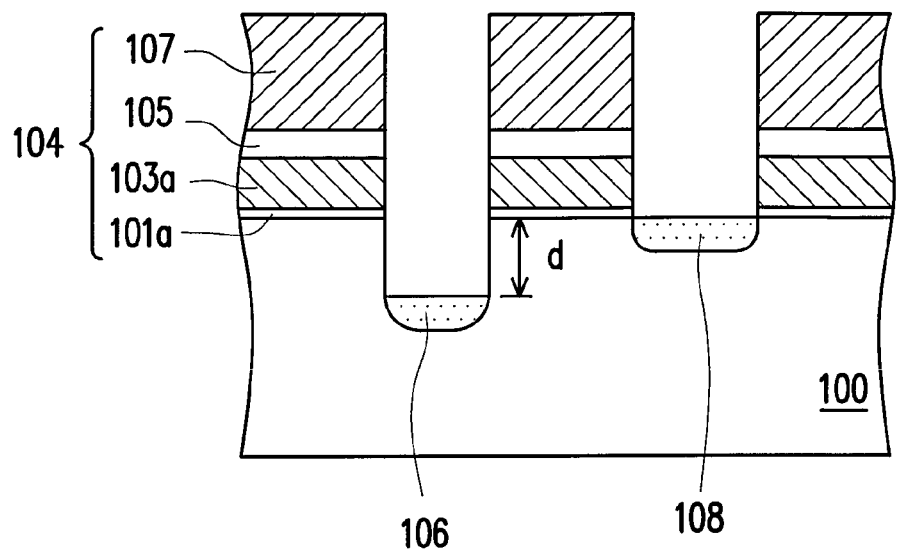
Figure 3D:
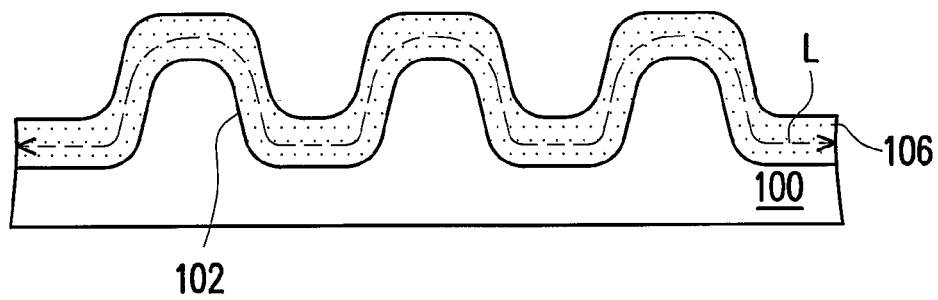
Figure 3A:
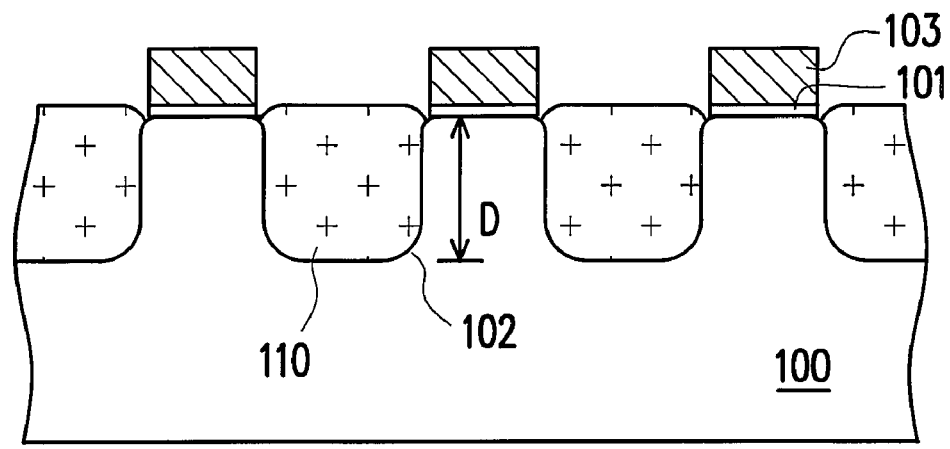
Figure 4A:
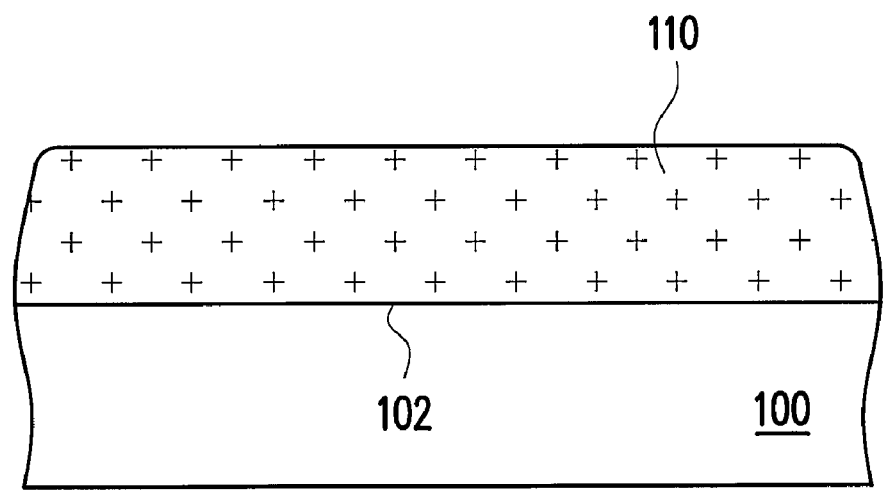
FIGS. 4A to 4D schematically illustrate cross-sectional views taken along the line IV-IV' in FIGS. 1A to 1D.
Figure 4B:
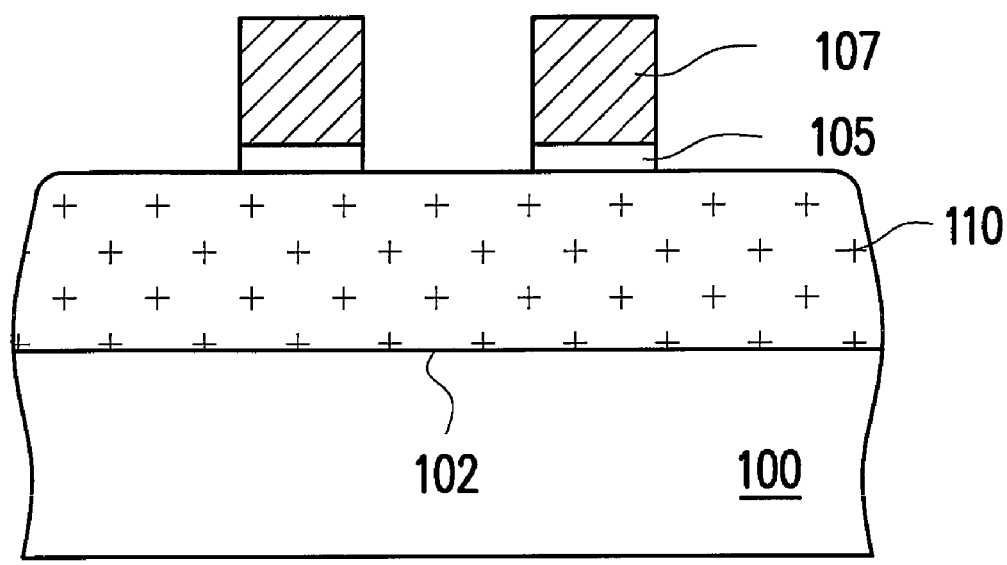
Figure 4C:
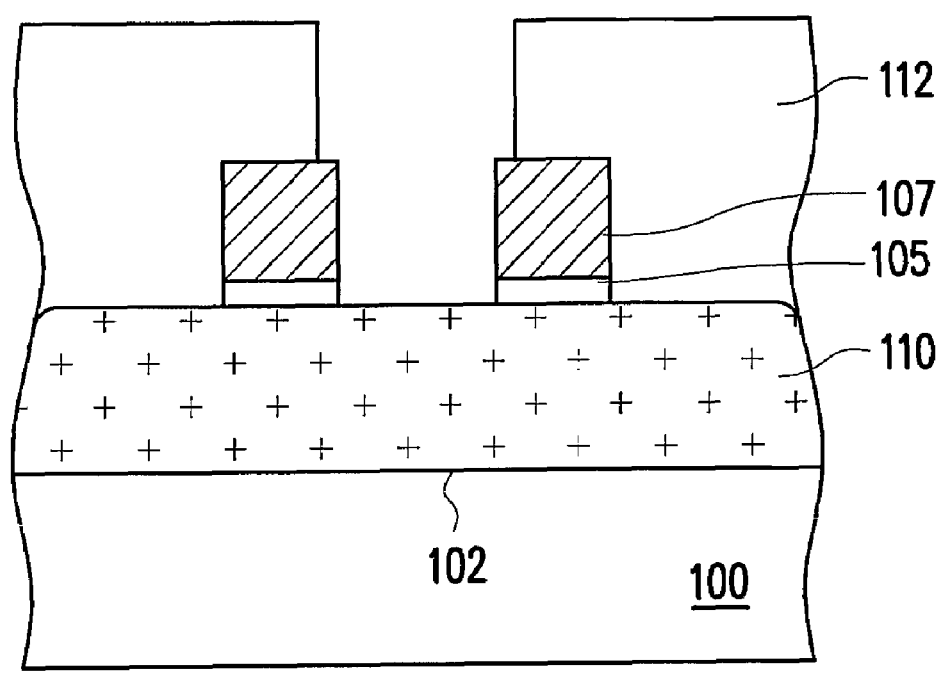
Figure 4D:
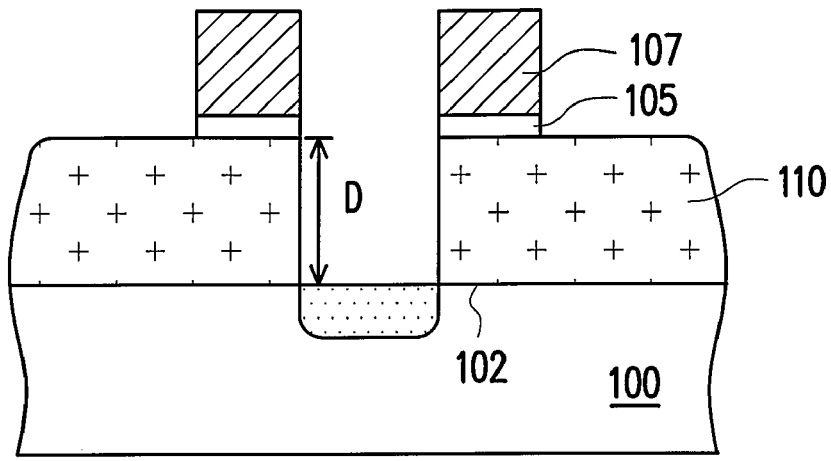

In the following embodiment, a memory array disposed on a substrate is taken as an example to describe the present invention. FIGS. 1A to 1D schematically illustrate top views of a method of fabricating a memory array according to an embodiment of the present invention. FIGS. 2A to 2D schematically illustrate cross-sectional views taken along the line II-II' in FIGS. 1A to 1D. FIGS. 3A to 3D schematically illustrate cross-sectional views taken along the line III-III' in FIGS. 1A to 1D. FIGS. 4A to 4D schematically illustrate cross-sectional views taken along the line IV-IV' in FIGS. 1A to 1D.

Referring to FIGS. 1A to 4A, a substrate 100 having a plurality of trenches 102 with a depth D arranged in parallel is provided. Thereafter, an isolation structure 110 such as a shallow trench isolation (STI) structure is formed in the trenches 102. The substrate 100 may be a semiconductor substrate, such as a silicon substrate. The material of the isolation structure 110 is, for example, oxide. Afterwards, a first dielectric layer 101 and a first conductive layer 103 are sequentially formed on the substrate 100 between the trenches 102. The method of forming the first dielectric layer 101 and the first conductive layer 103 includes the following steps. A first dielectric material layer (not shown) and a first conductive material layer (not shown) are sequentially formed over the substrate 100. Then, a portion of the first dielectric material layer and a portion of the first conductive material layer are removed, so as to form the first dielectric layer 101 and the first conductive layer 103. The material of the first dielectric layer 101 is, for example, oxide. The material of the first conductive layer 103 is, for example, doped polysilicon.

Referring to FIGS. 1B to 4B, a second dielectric layer 105 and a second conductive layer 107, crossing the isolation structure 110, are sequentially formed on the substrate 100. The method of forming the second dielectric layer 105 and the second conductive layer 107 includes the following steps. A second dielectric material layer (not shown) and a second conductive material layer (not shown) are sequentially formed over the substrate 100, covering the first conductive layer 103 and the isolation structure 110. Then, a portion of the second dielectric material layer and a portion of the second conductive material layer are removed, so as to form the second dielectric layer 103 and the second conductive layer 107. During the step of removing the portion of the second dielectric material layer and the portion of the second conductive material layer, a portion of the first dielectric layer 101 and a portion of the first conductive layer 103 thereunder are also removed, so as to form a first conductive layer 101a and a first conductive layer 103a. The second dielectric layer 105 may be an ONO composite layer, for example. The material of the second conductive layer 107 is, for example, doped polysilicon. In this embodiment, the first conductive layer 101a, the first conductive layer 103a, the second dielectric layer 105 and the second conductive layer 107 form a gate structure 104, wherein the first dielectric layer 101a serves as a tunneling dielectric layer, the first conductive layer 103a serves as a floating gate, the second dielectric layer 105 serves as an inter-gate dielectric layer and the second conductive layer serves as a control gate.

Further, a self-aligned source process which will be described below is performed. Referring to FIGS. 1C to 4C, a patterned photoresist layer 112 is formed over the substrate 100, exposing at least the substrate 100 between the trenches 102 at the side 114 of the gate structure 104 and the isolation structure 110 in the trenches 102 at the side 114 of the gate structure 104. The side 114 of the gate structure 104 is defined as the side facing the common source region. In this embodiment, a portion of the second conductive layer 107 is exposed by the patterned photoresist layer 112. In another embodiment (not shown), the patterned photoresist layer 112 can be aligned with the side 114 of the gate structure 104.

Referring to FIGS. 1D to 4D, an etching process is performed by using the patterned photoresist layer 112 as a mask. The etching process may be a dry etching process in which the etching parameters can be adjusted so that the oxide etching rate is faster than the silicon etching rate, but the etching rate for the layer including doped polysilicon is quite slow. In details, during the etching process, the isolation structure 110 (the material thereof may be oxide) in the trenches 102 at the side 114 of the gate structure 102 and a portion of the substrate 100 (the material thereof may be silicon) between the trenches 102 at the side 114 of the gate structure 104 are removed, but the portion of the second conductive layer 107 (the material thereof may be doped polysilicon) exposed by the photoresist layer 112 is not. Thus, the portion of the substrate 100 between the trenches 102 at the side 114 of the gate structure 104 is lower than the surface of the substrate 100 under the gate structure 104 by a distance d, and the distance is greater than 300 Å. It is noted that, in another embodiment, the distance d is preferably greater than 500 Å or more preferably greater than 700 Å.

As the device is constantly miniaturized, the distance d in another embodiment is greater than 0.15 times a depth D of the trenches 102, preferably greater than 0.25 times the depth D, or more preferably greater than 0.35 times the depth D.

Thereafter, the patterned photoresist layer 112 is removed. Afterwards, a doped region 106 and a doped region 108 are formed at two sides of the gate structure 104 by the known methods such as an ion implantation process. The doped region 106 serving as a common source region is formed at the side 114 of the gate structure 104. The doped region 108 serving as a drain region is formed at the side 116 of the gate structure 104. The process for fabricating a memory array is thus completed.

Figure 5:
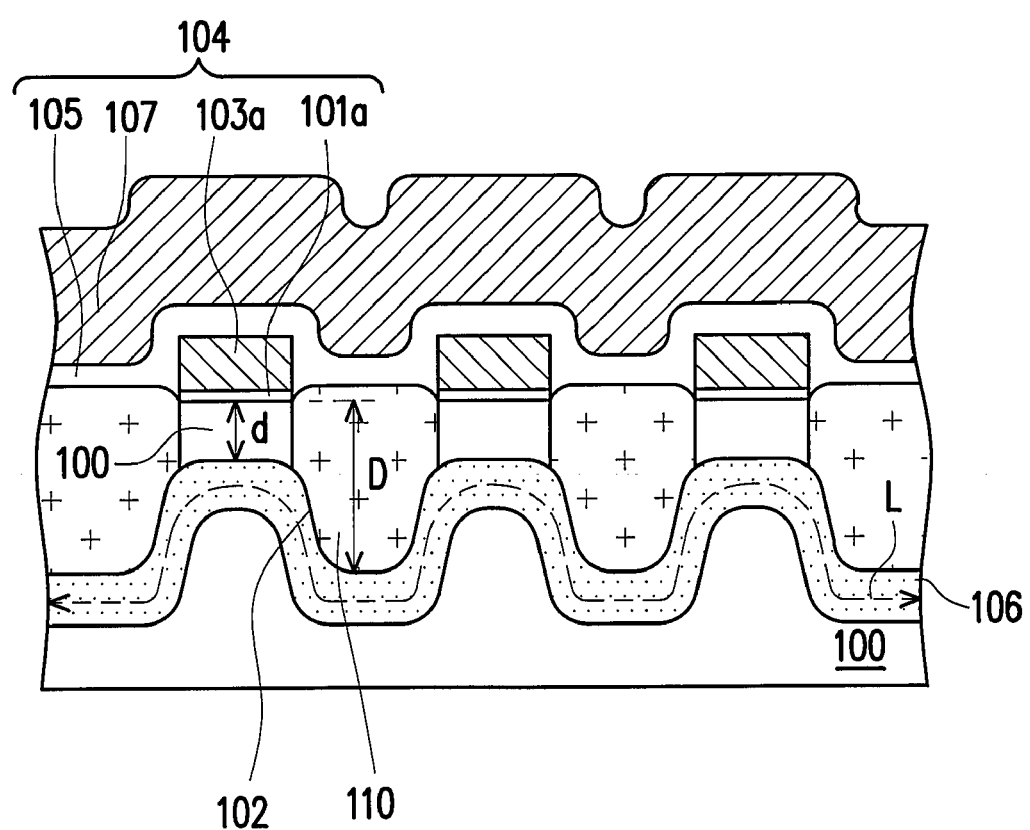
FIG. 5 schematically illustrates a cross-sectional view taken along the line V-V' in FIG. 1D.

A structure of the memory array will be introduced in the following. FIG. 5 schematically illustrates a cross-sectional view taken along the line V-V' in FIG. 1D. Referring to FIGS. 1D, 2D, 4D and 5, a substrate 100 having a plurality of trenches 102 arranged in parallel is provided. Each memory in the memory array is disposed on the substrate 100 and including a gate structure 104, a doped region 106 and a doped region 108. The gate structure 104 is disposed on the substrate 100 between the trenches 102. The gate structure 104 includes a first dielectric layer 101a, a first conductive layer 103a, a second dielectric layer 105, and a second conductive layer 107 sequentially disposed on the substrate 100. Moreover, the second conductive layer 107 of each memory in the same row crosses over the isolation structure 110 in the trenches 102 to connect with one another and to be used as a word line. It is noted that, in the trenches 102, the isolation structure 110 exposes a region to be used as a common source region.

The doped region 106 and the doped region 108 are respectively disposed at two sides 114 and 116 of the gate structure 104. The doped region 106 is disposed in the substrate 100 between the trenches 102 and in the sidewalls and bottoms of the trenches 102 to serve as the common source region of the memory array. The doped region 108 is disposed in the substrate 100 between the trenches 102 to serve as a drain region of the memory. Moreover, the top surface of the doped region 106 in the substrate 100 between the trenches 102 is lower than the surface of the substrate 100 under the gate structure 104 by a distance d, and the distance d is greater than 300 Å.

Because the top surface of the doped region 106 in the substrate 100 between the trenches 102 is lower than the surface of the substrate 100 under the gate structure 104, a distance between the top surface of the doped region 106 and the bottom of each of the trenches 102 is thereby reduced. Consequently, a current path L of the doped region 106 which serves as the common source region is also shortened to reduce the resistance of the common source region. It is noted that, in another embodiment, the distance d is preferably greater than 500 Å or more preferably greater than 700 Å to further shorten the current path L.

As the device is constantly miniaturized, the distance d in another embodiment is greater than 0.15 times a depth D of the trenches 102, preferably greater than 0.25 times the depth D, or more preferably greater than 0.35 times the depth D, so as to effectively shorten the current path L and reduce the resistance of the common source region. Thereby, the efficiency of the device can be enhanced.

To sum up, the present invention reduces the distance between the top surface of the common source region and the bottom of each of the trenches to shorten the current path of the common source region. Consequently, the resistance of the common source region can be effectively reduced to enhance the efficiency of the device.

Although the present invention has been disclosed by the above embodiments, they are not intended to limit the present invention. Persons skilled in the art may make some modifications and variations without departing from the spirit and scope of the present invention. Therefore, the protection range of the present invention falls in the appended claims.

What is claimed is:

1. A memory disposed on a substrate in which a plurality of trenches is arranged in parallel, the memory comprising:
   a gate structure, disposed between the trenches; and
   a doped region, disposed at one side of the gate structure, in the substrate between the trenches and in the sidewalls and bottoms of the trenches, wherein a top surface of the doped region in the substrate between the trenches is lower than a surface of the substrate under the gate structure by a distance, and the distance is greater than 300 Å.

2. The memory as claimed in claim 1, wherein the distance is greater than 500 Å.

3. The memory as claimed in claim 2, wherein the distance is greater than 700 Å.

4. The memory as claimed in claim 1, wherein the gate structure comprises a dielectric layer, a floating gate, an intergate dielectric layer, and a control gate sequentially disposed on the substrate.

5. The memory as claimed in claim 1, further comprising an isolation structure disposed in the trenches and exposing the doped region.

6. A memory disposed on a substrate in which a plurality of trenches is arranged in parallel, the memory comprising:
   a gate structure, disposed between the trenches; and
   a doped region, disposed at one side of the gate structure, in the substrate between the trenches and in the sidewalls and bottoms of the trenches, wherein a top surface of the doped region is lower than a surface of the substrate under the gate structure by a distance, and the distance is greater than 0.15 times a depth of the trenches.

7. The memory as claimed in claim 6, wherein the distance is greater than 0.25 times the depth of the trenches.

8. The memory as claimed in claim 7, wherein the distance is greater than 0.35 times the depth of the trenches.

9. The memory as claimed in claim 6, wherein the gate structure comprises a dielectric layer, a floating gate, an intergate dielectric layer, and a control gate sequentially disposed on the substrate.

10. The memory as claimed in claim 6, further comprising an isolation structure disposed in the trenches and exposing the doped region.

* * * * *